(12) United States Patent
Soma Raju et al.

(10) Patent No.: US 8,674,262 B2
(45) Date of Patent: Mar. 18, 2014

(54) METHOD OF DEPOSITING ELECTRICALLY CONDUCTIVE ELECTRODE MATERIAL ONTO THE SURFACE OF AN ELECTRICALLY CONDUCTIVE WORK PIECE

(75) Inventors: Kalidindi Ramachandra Soma Raju, Hyderabad (IN); Chebrolu Sambasiva Rao, Hyderabad (IN); Ribalko Alexander Vasilyevich, Kishinev (MD)

(73) Assignee: International Advanced Research Centre for Powder Metallurgy and New Materials (ARCI), New Delhi (IN)

( * ) Notice: Subject to any disclaimer, the term of this patent is extended or adjusted under 35 U.S.C. 154(b) by 124 days.

(21) Appl. No.: 13/208,721

(22) Filed: Aug. 12, 2011

(65) Prior Publication Data

US 2011/0290764 A1    Dec. 1, 2011

Related U.S. Application Data

(62) Division of application No. 11/384,946, filed on Mar. 20, 2006.

(30) Foreign Application Priority Data

Jun. 25, 2005    (IN) .......................... 1610/DEL/2005

(51) Int. Cl.
*B23K 9/10*    (2006.01)
(52) U.S. Cl.
USPC .................. 219/130.51; 219/76.1; 219/76.14

(58) Field of Classification Search
USPC ........ 219/130.1, 130.51, 130.5, 130.21, 76.1, 219/76.14
See application file for complete search history.

(56) References Cited

U.S. PATENT DOCUMENTS

| | | | |
|---|---|---|---|
| 3,136,884 A | 6/1964 | Glenn et al. | |
| 3,492,593 A | 1/1970 | Ullmann et al. | |
| 3,939,321 A | 2/1976 | Bertrand et al. | |
| 3,988,760 A * | 10/1976 | Cline et al. | 257/110 |
| 4,346,281 A | 8/1982 | Inoue | |
| 4,405,851 A | 9/1983 | Sheldon | |
| 4,666,567 A * | 5/1987 | Loch | 205/83 |
| 4,866,237 A | 9/1989 | Inoue | |
| 5,448,035 A | 9/1995 | Thutt et al. | |
| 5,640,313 A | 6/1997 | Takehara et al. | |
| 5,726,419 A * | 3/1998 | Tabata et al. | 219/130.51 |
| 5,980,681 A | 11/1999 | Siemroth et al. | |
| 6,020,568 A | 2/2000 | Joseph | |
| 6,297,157 B1 * | 10/2001 | Lopatin et al. | 438/687 |
| 6,417,477 B1 | 7/2002 | Brown et al. | |
| 6,835,908 B2 | 12/2004 | Bailey et al. | |
| 2004/0021451 A1 * | 2/2004 | Stava | 323/282 |
| 2006/0131175 A1 * | 6/2006 | Anton et al. | 205/104 |

* cited by examiner

*Primary Examiner* — Henry Yuen
*Assistant Examiner* — Ayub Maye
(74) *Attorney, Agent, or Firm* — The Webb Law Firm (57) ABSTRACT

The present invention is a device for coating surfaces of metallic work pieces with an electrically conductive material by employing short duration high current packets of pulses in which the work piece forms the cathode and the consumable coating material forms the anode, which are connected to a generator for generating pulses by charging and discharging a bank of capacitors using a MOSFET. The invention is also a device for controlling the on and off time of a metal oxide semiconductor field effect transistor (MOSFET).

3 Claims, 5 Drawing Sheets

METHOD OF DEPOSITING ELECTRICALLY CONDUCTIVE ELECTRODE MATERIAL ONTO THE SURFACE OF AN ELECTRICALLY CONDUCTIVE WORK PIECE

CROSS REFERENCE TO RELATED APPLICATIONS

This application is a divisional application of co-pending U.S. patent application Ser. No. 11/384,946, filed Mar. 20, 2006, which is herein incorporated by reference in its entirety and which corresponds to Indian Patent Application No. 1610/DEL/2005 filed Jun. 25, 2005.

FIELD OF THE INVENTION

The invention relates to a device for controlling the on & off time of the metal oxide semi conductor field effect transistor (MOSFET), a device for spark coating the surfaces of metal work piece incorporating the said control device and a method of coating metal surfaces using the said device. The present invention particularly relates to a device producing thicker metallic, carbide and cermet composite coatings on electrically conductive metallic substrates and method of coating using the said device. The present invention more particularly relates to a device for producing thicker and uniform coatings on metallic substrates by electrospark coating, which is also known as electro spark alloying and a method for coating said substrates.

The coatings obtained by using the device of the present invention have lower surface roughness, improved tribological properties and excellent wear resistance. The present invention also relates to a device for carrying out the above-mentioned process.

BACKGROUND OF THE INVENTION

Metals, especially different steels and their alloys, and more specifically high speed steels (HSS) are commercially used in cutting tool industries as structural members or tools as also in engineering industries in applications widely ranging from kitchen knives to turbine components. Use of these materials is dictated by the cost and strength requirement. Though available in abundance at affordable prices, these materials have certain limitations such as less wear resistance, its degree depending on the percentage of carbon and other alloying elements.

Heat treatment of steels is a well-known process of hardening, which is in use for the last 100 years or more. The hardened layer provides high-level protection against wear, tear and corrosion. Various hard facing techniques such as welding, laser hardening, plasma spraying, high velocity oxy fuel spraying, detonation spraying have been well developed and widely used by engineering industries to produce hard wear resistant coatings. Thin coating techniques such as physical vapor deposition (PVD) and chemical vapor deposition (CVD) are also developed for improving service life of cutting tools and other engineering components.

All these coatings are essentially employed on components, made of different metals and alloys, to combat various forms of wear, tear and corrosion to enhance their service life. However, most of these techniques demand a high degree of pre-coating and post-coating operations that are often not cost effective. Moreover, these techniques produce large quantities of heat thereby forming heat-affected zones, which can lead to component warping, dimensional change and rejection of the components.

Size, shape and complexity of geometry of engineering components do restrict the applicability of thermal spray techniques. Moreover, these techniques require high quality and costly powders such as Tungsten Carbide-Cobalt, Chromium Carbide-Nickel Chrome, prepared by specially developed manufacturing routes such as atomization, fusing, sintering & crushing, chemical reduction and blending. Deposition efficiency of these powders is mostly less than 60%.

Hard facing is a term that refers to the deposition of filler metal on the surface of a work piece to improve its wear properties against abrasion, impact, erosion, galling & cavitation. It can also play an important role in enhancing the surface properties of a material to suit service conditions that impose an upper limit on the dimensions of a part. Cladding, surfacing, build up and buttering are some of the other categories that represent hard facing techniques.

Cladding is a process in which a relatively thick layer of filler metal is produced on a carbon or low-alloyed steel substrate to improve its corrosion resistance against such unfriendly atmospheres. Buildup refers to the addition of a weld metal to a base metal surface or to the edge of the joint or to a previously deposited weld metal for restoring the component dimensions to the required values. Buttering refers to the addition of one or more layers of a weld metal to the face of the joint or surface to be welded. Unlike build up, buttering is carried out for metallurgical reasons and not for dimensional control. Buttering is used especially for joining dissimilar metals and when stress relieving of the complete weld is not desirable.

Surfacing is generally used to improve, repair and rework a part so that it will have properties better than those of the actual part itself. In most of such cases, chemical compositions and mechanical properties have to be carefully considered, as they may be different for the surfacing material and the base material. Furthermore, dilution, which is defined as the percentage ratio of work piece melted to the total sum of the filler material and work piece material can also be an important consideration.

As most of the surface modification processes discussed above employ some means of heating, they lead to severe thermal stresses, which may warp or damage the work piece and thereby damage the surface produced. In addition to the above considerations, all these surface modification processes must be economical and be capable of being carried out in house.

In order to avoid the major problems associated with the above processes without sacrificing the advantages associated with welding, spark coating has been developed. This is also known by other names such as "Spark Alloying", "Spark Hardening", "Spark Toughening", "Pulsed Electrode Surfacing" and "Electrospark Deposition".

The Electro Spark Coating (ESC) method is well known and the essence of this method is as follows: Current pulses are generated between a processing electrode and the work piece, which are periodically brought in contact with each other. As they approach each other, at a particular moment, the breakdown of the inter electrode gap takes place and an electric discharge is produced, through which the energy stored in capacitors is released. This spark discharge results in erosion and results in the transfer of the material of the processing electrode onto the work piece i.e. it produces a surface coating and forms a modified layer on the surface of the work piece.

By sweeping the electrode over a selected zone of the work piece, a metallurgical modification such as surface alloying or hardening of the selected area in the work piece can be obtained. In this technique, both the consumable electrode i.e. coating material and the job i.e. work piece, should be electrically conductive as both of them are connected to the positive and negative terminals of a DC supply. The material to be deposited forms an electrode, which is mounted on an electromagnetic vibrator. The vibrations that are generated by the electromagnetic vibrator produce the periodic make and break of the contact between the consumable electrode and the work piece, which therefore initiate and define the rate and frequency at which the pulse discharges occur. These vibrations that are generated at the electromagnetic vibrator also prevent welding of the consumable electrode that is mounted on it to the work piece.

Auxiliary movements such as rotation of the electrode about its axis and a combination of rotation and linear vibrations have also been explored.

The phenomena of transferring a consumable electrode material on to a substrate material by means of short duration electrical discharges has been carried out in a variety of ways over several decades. The following references are representative of such coating processes.

BRIEF DESCRIPTION OF THE DRAWINGS OF PRIOR ART

The prior art referred to in the U.S. Pat. No. 4,405,851, year 1983, discloses a common method for depositing hard anode material on to the cathode work piece through electro sparking. The device of the prior art works on a resistance-capacitance (RC) relaxation circuit shown in FIG. 1, employing a vibratory electrode holder (1) to make and break the contact between an anode (4) (consumable electrode) and a cathode (2) (work piece) at regular intervals. When direct current DC (6) is supplied to the circuit resulting sparks between anode cathode pair melts and spray-deposits, part of the electrode (4) on to the work piece (2). A capacitor (3) is used in parallel with a direct current source (6) for producing a high-energy short duration spark. A ballast (5) is connected between the positive lead of the circuit and the electrode (4). The negative lead of the circuit is connected to the work piece (2).

Figure 1:
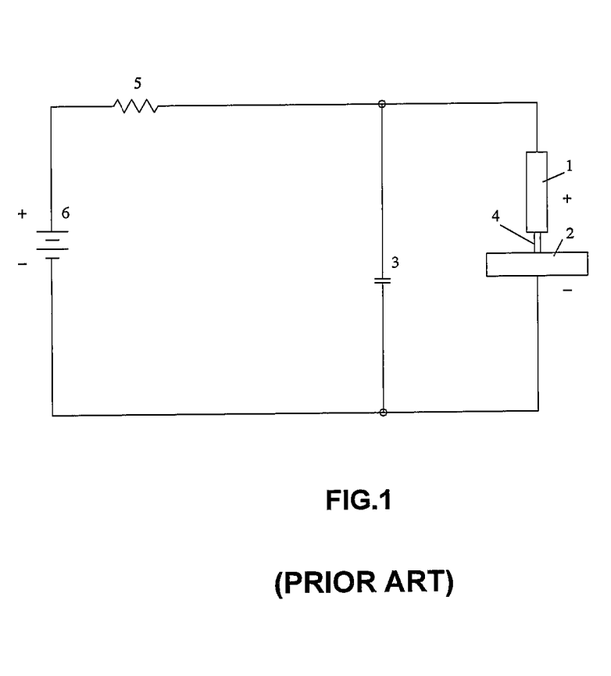
FIG. 1 of the drawing accompanying this specification represents the schematic view of prior circuitry of Electro-spark coating mentioned as a prior art in U.S. Pat. No. 4,405,851

It was assumed that the molten metal produced from the high temperature spark is transferred from the anode (4) to the cathode work piece (2) of the circuit possibly by an expanding gas bubble. Although similar to welding, this material transfer involves a complex mechanism. during the process of material transfer, the material reacts with the atmosphere where the coating is being applied e.g. nitrogen and oxygen, from the air in the atmosphere. The desired high-energy short duration spark is produced by connecting a capacitor (3) in parallel with the direct current source (6). The value of the resistor (5) must be large enough to prevent arcing after breakdown (capacitor discharge) has been initiated across the gap. A large resistance prevents arcing but reduces the maximum energy that can be released from the capacitor. This is the inherent difficulty with this process of depositing thicker coatings.

Further disclosure in a modified circuit of their invention in U.S. Pat. No. 4,405,851, shows that their circuit can work with either a single phase or a three-phase alternating current supply. Instead of a ballast or load resistor (5) as shown in FIG. 1, a high-speed thyristor switch (10) is used to control the capacitor discharge. High frequency switching can be used to open and close the capacitor-work piece-electrode circuit. The circuit shown in FIG. 2 includes a clamp (13) for holding and oscillating the anode (12) about a central axis on the work piece (14). The switching device (9) is also provided for repeatedly switching the circuit on & off at a predetermined rate. An independent trigger pulse generator is supplied & connected to the thyristor for producing selectively spaced and controlled pulses in series with the positive lead. In this circuit, the capacitance value is reported to be in the range of 2 to 800 µF. Two Diodes (7) & (8) are used to bypass and short out the reverse current through the electrode-work piece contact area & connecting leads and protect the thyristor against reversals.

Figure 3:
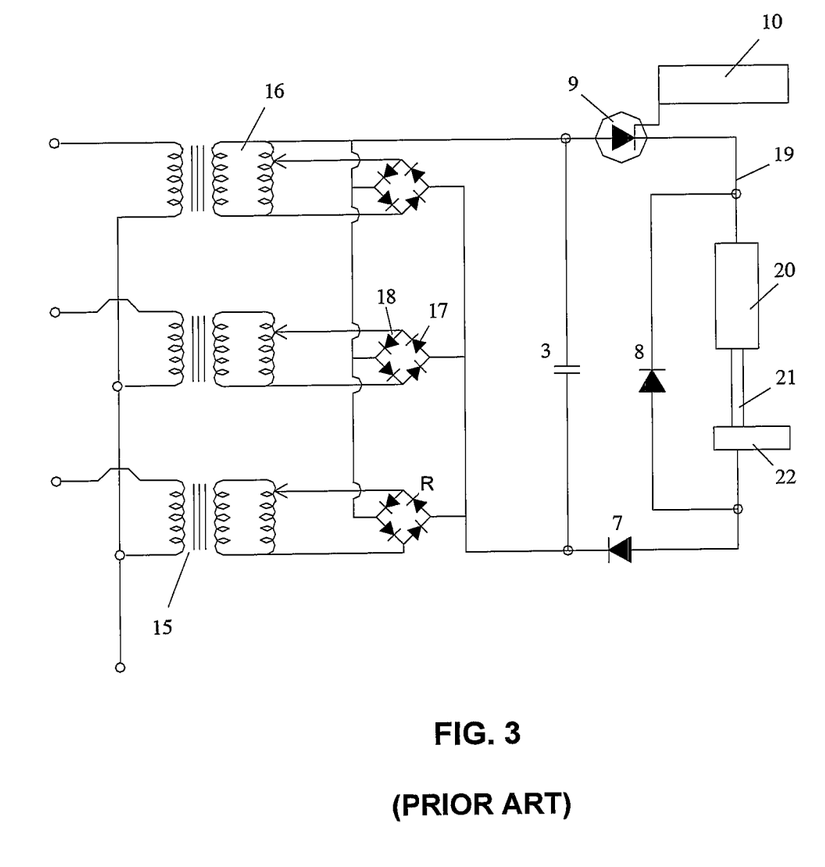
FIG. 3 represents the schematic view of the apparatus and circuitry for transfer of metallic materials by electric discharge using alternating current source protected by the U.S. Pat. No. 4,405,851
Figure 4:
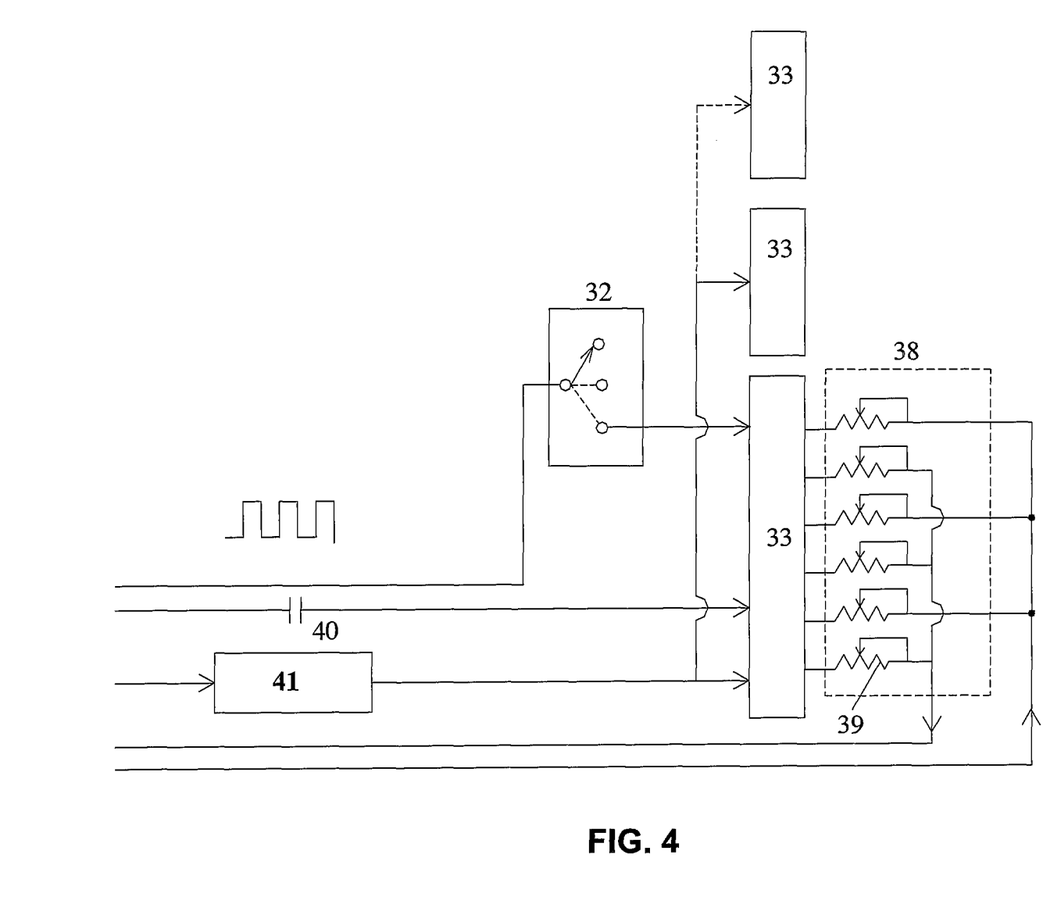
FIG. 4 shows the device (circuit) of the present invention for generation and controlling pulses in packets to drive and control the on & off time of Metal Oxide Semi conductor Field Effect Transistor (MOSFET) of the present invention.

The device shown in FIG. 3 uses a current transformer (15) with primary winding connected to a three-phase alternating current supply. The secondary winding is connected to a variable transformer (16) to control the voltage at electrode [anode] (21). The Secondary winding is connected to the rectifier (R) that provides the current for charging the single storage capacitor. The outputs of all the three rectifiers are connected in parallel to the single capacitor (3).

Figure 2:
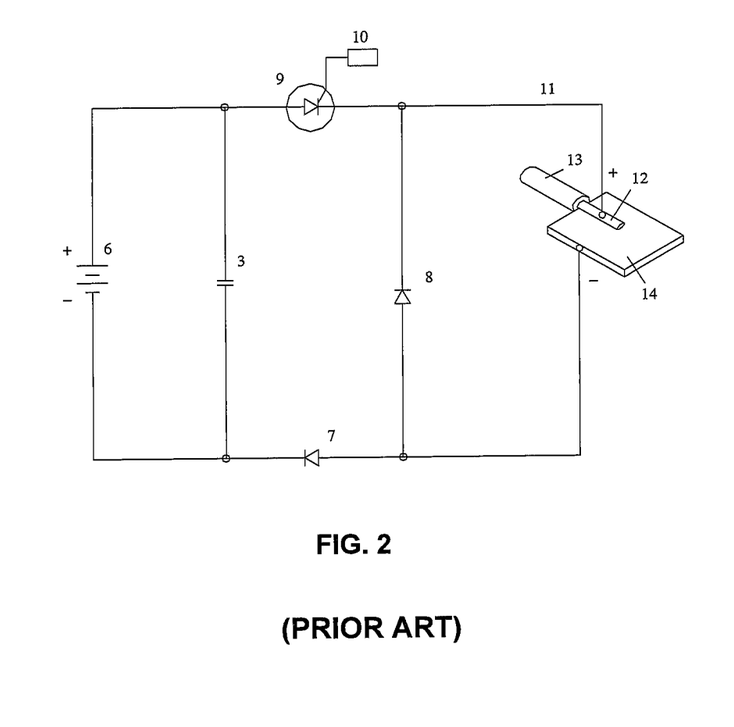
FIG. 2 represents the schematic view of apparatus and circuitry for transfer of metallic materials by electric discharge using direct current source protected in the U.S. Pat. No. 4,405,851)

The voltage requirement of the circuits shown in FIG. 2 and FIG. 3 range from 60V to 120V and these devices produce coatings with a surface roughness of 40 µm $R_a$ or more. The working voltage range, mentioned above, is hazardous for the operator and precautions must be taken to avoid accidents. Likewise, the surface roughness values are un-acceptable for most applications in an as-coated condition. Although finishing operations such as polishing and buffing can reduce the roughness, the consequent reduction in the coating thickness renders them unsuitable for any application.

U.S. Pat. No. 4,346,281, year 1982, discloses a method and apparatus for the surface treatment of metallic work pieces using a multiple electrode-rotating tool. The difference between the device of this patent as compared to the device mentioned above is the use of multiple anodes.

Slapping contact of each of the electrode with work piece results in spark discharge and hence coating when both of them are connected to the positive and negative poles of the direct current power supply. The electrode should be less than 2 mm in diameter and the length up to 8 mm. Chance of electrode fracture is very high as the speed range is very high from 50 to 20,000 rpm. Spark duration was 60 microseconds and coatings were deposited with the help of rotating tool electrode holder. Working voltage was not mentioned while deposition rate mentioned was 22 mg/min.

U.S. Pat. No. 4,866,237, year 1989, discloses another apparatus and a method where longitudinal vibration, in addition to travel of the electrode along a path, which is not perpendicular to but has a proper slant angle with the work piece, was provided in order to get a motion of slow approach and subsequent moving away of the electrode (anode) from the work piece. Capacitance values were not mentioned whilst the working voltage was mentioned as 50 V, pulse duration 200 microseconds and coating thickness was limited to less than 50 micrometers. Tubular consumable electrode was employed for obtaining maximum deposition.

U.S. Pat. No. 5,448,035, year 1995, discloses yet another method and apparatus for pulse fusion surfacing where the electrode holder rotates and oscillates the electrode simultaneously to increase the quantity of the deposit. The spark rate was varied according to various process parameters. Thyristor fired trigger/discharge resistance capacitance circuit and a stepper motor were controlled by a microprocessor. The thyristor-controlled circuit works at a voltage range of 40-70 V. Single pulse train produces coatings whose thickness was limited to 25 micrometers with tungsten carbide cobalt electrode. Oscillating frequency, rotational direction and speed of electrode can be controlled to achieve coatings with predetermined morphology and thickness on work piece.

U.S. Pat. No. 5,980,681, year 1999, describes a process for treatment of metal work piece surface by electrical discharges. The process was designed in such a way that microscopic melting of the work piece surface was avoided while ensuring extinction of the individual are discharges. This process was employed for roughening a metal work piece surface. Pulses of 50 A current and 20 micro second duration were employed.

U.S. Pat. No. 6,020,568, year 2000, describes an electromechanical process and apparatus for metal deposition using a direct current source. This apparatus basically includes an ultrasonic generator, a work piece holder, mounting attachments for holding the material to be coated on ultrasonic horn. The main difference being the use of ultrasonic generator instead of vibrating electrode holder. The coating thickness was limited by 5 micrometers/pass. The frequency of ultrasound may be in the range of 10 kHz to 40 kHz.

U.S. Pat. No. 6,417,477 B1, year 2002, discloses a method and apparatus for Electrospark alloying. Externally cooled special collet was incorporated to hold the consumable electrode for improving the deposition rate. While working voltage was 120 V, total capacitance value mentioned was 40 microfarads. A rotating tool electrode holder was employed for depositing the coatings in controlled atmosphere such as argon and vacuum. The deposition rate was mentioned to be 2.5 mg/min in air while the same is reduced by ⅓ in controlled atmosphere.

U.S. Pat. No. 6,835,908 B2, year 2004, describes still another method and apparatus for controlling Electrospark deposition using electrical variable wave forms from the Electrospark deposition process as a feed back parameters for optimizing the contact force between consumable anode and work piece cathode. The plurality of amplitudes of series of electrical energy pulses delivered to consumable electrode and work piece pair were measured and correlated to the contact force between electrode tip and work piece. With such set up it was claimed the flawed areas such as pits and groves can also be effectively coated. However, deposition rate and other electrical parameters were not revealed.

To sum up, the above prior art methods and apparatus employ higher working voltages ranging from 60 to 120 V or even more, a single pulse train (one pulse with a fixed width), lower pulse durations (less than 100 μsecond), higher current and lower capacitance values and thyristors or thyratrons as the pulses switching devices. All these factors lead to lower deposition rates and higher coating roughness. It is also clear from the above prior art information that the coating thickness is limited to at the most 50 microns when carbide materials are deposited on steel substrates. Moreover, the improvement in performance parameters due to these coatings is reported to be less than or equal to 500 times that of the bare sample when tested in pin on disk test rig. The resulting coatings are also not found to be uniform.

In summary the conventional spark deposition, whether they are vibratory, rotatory or multi electrode holder, are undesirably limited to achieve satisfactory results with regards to the thickness of the coating/deposit, rate of deposition and the treated surface roughness and uniformity of the deposited layer.

In spite of the wide variety of earlier processes, there is still scope for improving the thickness and reducing the surface roughness of the Electrospark coatings that can be deposited on any electrically conducting work pieces for example steels, their alloys and super alloys so as to increase the spectrum of application using this technique.

The main drawback of the earlier devices was that the roughness of the processed surface is a sizable fraction, ¼ to ½ or more, of the average thickness of the total deposited coated layer, which results in a poorer quality of the obtained surface. Moreover, the earlier devices do not permit a uniform increase in the thickness of the deposited layer as additional pulses can only result in the generation of sparks from the peaks of the previously deposited top layer, which can worsen the surface roughness even more.

The present invention is directed towards improving the thickness and reducing the surface roughness of the Electrospark coatings that can be deposited on any electrically conducting work pieces as well eliminating the difficulties of the prior art devices.

Considering these objectives and to meet the present day need for coatings with improved coating thickness, and better tribological, electrical and wear resistance properties, research work for developing improved Electrospark coating methods and devices has gained importance.

OBJECTIVES OF THE INVENTION

Therefore, the main objective of the present invention is to provide an improved device for spark coating the surfaces of metal work piece by electrical discharges overcoming the drawbacks of the hitherto known devices Another objective of the present invention is to provide an improved device for spark coating on the surface of electrically conductive metals and their alloys, in particular steel and its alloy bodies for obtaining dense, hard, uniform and thick coatings with increased rate of deposition and low surface roughness consistent in operation for desired results and allows selection of operation parameters depending up on the electrode and work piece material combinations.

Still another objective of the present invention is to provide an improved device for controlling the on & off time of Metal Oxide Semi conductor Field Effect Transistor (MOSFET)

Yet another objective of the present invention is to provide an improved method for spark coating the surfaces of metal work piece by electrical discharges employing the device of the present invention Still another objective of the present invention is to provide an improved method for spark coating on the surface of electrically conductive metals and their alloys, in particular steel and its alloy bodies at very low working voltage for obtaining dense, hard, uniform and thick coatings using the device of the present invention.

Another objective of the present invention is to an improved method for spark coating on the surface of electrically conductive metals and their alloys, in particular steel and its alloy bodies, to protect them against wear, corrosion, and oxidation using electrical discharges by employing the device of the present invention.

Another objective of the present invention is to provide an improved method for spark coating on the surface of electrically conductive metals and their alloys, in particular steel and its alloy bodies, to protect them against wear, corrosion, and oxidation using electrical discharges, which is simple and economical using the device of the present invention.

The above objectives of the present invention have been achieved, according to the present invention, based on our observations, due to extensive R&D work that it would be advantageous to control capacitor discharge by a suitable high-speed Metal Oxide Semi conductor Field Effect Transistor (MOSFET) switch, which opens and closes the work piece electrode circuit (total circuit). By controlling the on & off periods of the MOSFET, the discharge rate of the capacitors can be varied over a wide range. Moreover a new pulse concept known as "packets" is introduced to significantly reduce surface roughness and improve the deposition rates.

The device of the present invention is described with reference to FIGS. 4 through 6 of the drawings accompanying this specification.

Accordingly, the present invention provides a device (FIG. 5) for controlling the on & off time of the Metal Oxide Semi conductor Field Effect Transistor (MOSFET) which comprises a pulse generator device (26) to generate packets of pulses, one terminal of which being connected to the Metal Oxide Semi conductor Field Effect Transistor (MOSFET) (27), and the other terminal to a rotary selector switch (32), the rotary switch being used for selection of predetermined pulses, their amplitudes and pauses referred to as "mode", a pulse generator (26) also controls the selection of integrated circuit switch (I.C. switch) (33) for selection of mode through another integrated circuit switch driver device (41), the I.C. switch (33) acting as a multiplexer and being connected to a set of variable resistors (39) through a pulse tuning device (38) and a timing capacitor (40) to a pulse generator device (26) for controlling on & off time of the pulses that drives the MOSFET (27), the pulse tuning device (38) consisting of a set of variable resistors (39) for each mode, positive and negative supply being fed to variable resistors (39) for charging and discharging pulses from pulse generator device (26).

Figure 5:
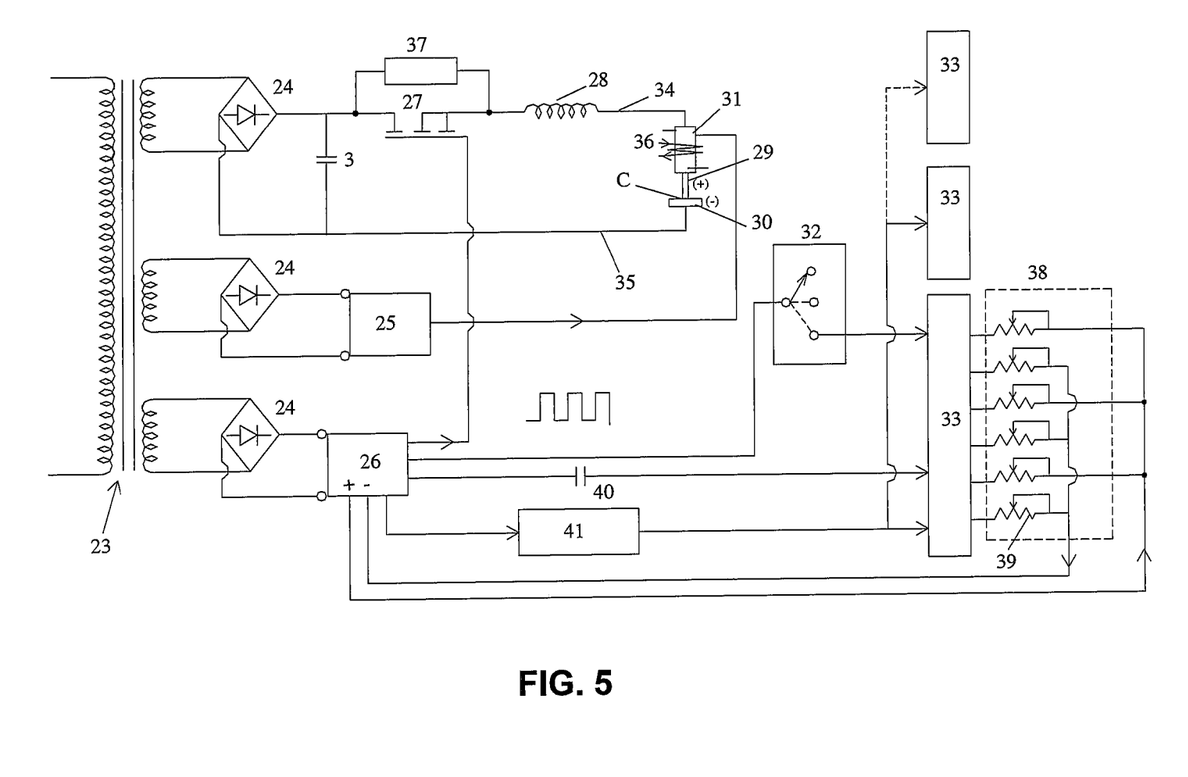
FIG. 5 shows the device of the present invention incorporating the device for the generation and controlling pulses in packets to drive and control the on & off time of Metal Oxide Semi conductor Field Effect Transistor (MOSFET).

According to another feature of the present invention there is provided a device for depositing an electrically conductive electrode material in the form of a rod on to the surface of an electrically conductive work piece by electrical discharges which comprises a capacitance bank (3) for charging and discharging current pulses of predetermined durations and amplitudes, the capacitance bank (3) being connected to an electrically conductive electrode (29) as anode, the anode being held by a vibro excitor (31) on a work piece (30) [cathode], the surface of which is desired to be coated, (34) being a low inductance anode cable and (35) being a cathode cable, switching means (27) being provided with a Metal Oxide Semi conductor Field Effect Transistor (MOSFET), a protection circuit (37) being connected to a protect MOSFET (27) against surge currents, one terminal of the switching means (32) being connected to MOSFET and another to a tuning circuit (26) to control the rate of discharge of the current pulses of predetermined durations and amplitudes, an alternating current transformer (23) having primary winding and three secondary windings, the primary winding being capable of being connected to an AC, 50 Hz source, all of the three secondary windings being connected to a rectifier (24), the second one being connected to the vibro excitor (31) through a device (25) for generating & controlling the frequency & amplitude of the vibro excitor, the third winding being connected to a device (26) for generating & controlling of pulses to on & off time of the MOSFET (27) and the other terminal to a rotary selector switch (32), the rotary switch being used for selection of predetermined pulses, their amplitudes and pauses referred to as "mode", a pulse generator (26) also controls the selection of integrated circuit switch (I.C. switch) (33) for selection of mode through another integrated circuit switch driver device (41), the I.C. switch (33) acting as a multiplexer and being connected to a set of variable resistors (39) through a pulse tuning device (38) and a timing capacitor (40) to a pulse generator device (26) for controlling on & off time of the pulses that drives the MOSFET (27), the pulse tuning device (38) consisting of a set of variable resistors (39) for each mode, positive and negative supply being fed to variable resistors (39) for charging and discharging pulses from pulse generator device (26).

The mains supply voltage of 230 V is stepped down to a voltage less than or equal to 40 V with the help of a transformer (23) having multiple secondaries that feed a rectifier (24), an electrode holding device or vibro-excitor (25) and a pulse tuning circuit (26). The bridge rectifier (24) feeds a bank of capacitors (3), whose capacitance is in the range of 5000 to 150000 microfarads. The energy stored in the bank of capacitors (3) is discharged at the contact of electrode (29) and substrate (30) through MOSFET (27). Pulse tuning circuit (26) is used to generate 1 to 3 pulses more specifically 3 as a packet by controlling variable resistor (39) and selector switch (32) which in turn determines the on to off time of the MOSFET. Choke (28) is meant for producing current pulses at the contact point 'C' of the electrode (29) and work piece (30).

For producing a better quality of the coated layer having a lower roughness on the processed work piece, mechanical smoothening of the surfaces is used or an additional processed surface is produced with a processing electrode, using lower electrical discharges levels.

However, flattening (smoothening) of the surface by any known method can be realized only by an additional operation, which cannot produce a quality surface with lesser roughness. Hence, a concurrent increase in the thickness of the coated layer in a single process cycle is not possible.

In a packet, the number of the additional current pulses, which follow each basic pulse, varies from 1 to 3. If the number of additional pulses is more than 3, then the consequent additional efficiency of the surface smoothening is reduced sharply, since the roughness of the surface is already close to the normal final value after the third additional pulse itself.

If the number of additional pulses is less than 1, i.e. 0, then the smoothening effect may not be present at all.

The main consideration for fixing the smoothening pulse amplitude levels to 30 to 70% of the basic current amplitude value is that this ratio permits maximum melting and flattening (smoothening) of the processed i.e. coated surface after the primary deposition has been completed by the basic current pulse.

If this value is reduced below 30%, then the smoothening action becomes quite insignificant. This is due to the fact that the process of smoothening requires careful control of the depth of melting so that full melting of only the rough upper-most surface of the deposited layer occurs and current values below 30% are inadequate for this.

On the other hand, if the amplitude of the smoothening current pulse is more than 70% of that of the basic current pulse, then the effect of the flattening/smoothening is very small, because there is hardly any difference between the energies of the basic and additional current pulses and therefore the roughness levels produced by them are also comparable, resulting in no improvement.

Figure 6:
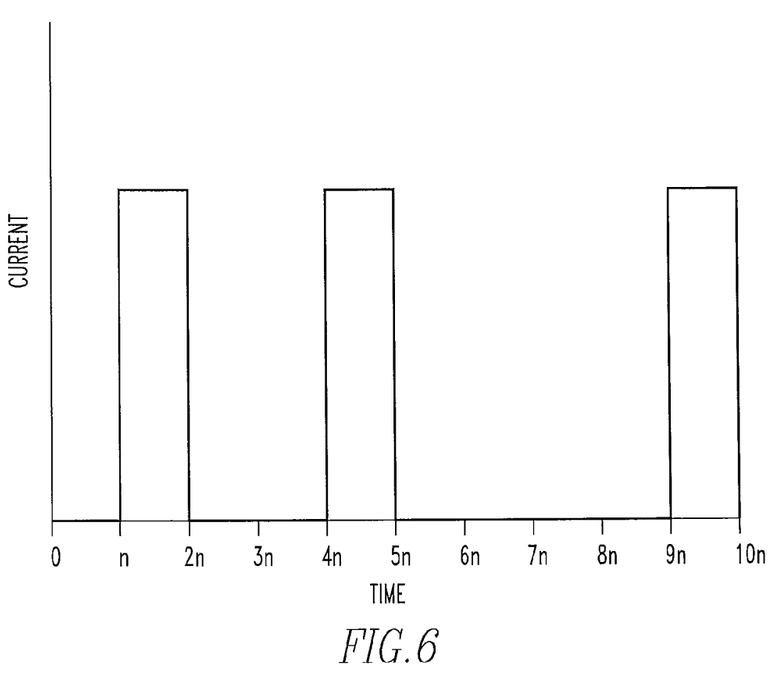
FIG. 6 is a graph illustrating the current pulses and the length of time of the pause between adjacent current pulses.

With reference to FIG. 6, the pause i.e. 'off' time between two consecutive current pulses lasts from 2 to 5 times the period i.e. duration or 'on' time of the previous current pulse, the typical current varying from 50 A to 1500 A for electrospark coating. If this pause is less than 2 time periods of the previous current pulse, then there is not enough time for any of the molten metal mass, produced by the previous pulse, to re-crystallize. Thus if the above criteria is not met, the depth of the molten pool from the start of the previous pulse till the end of the additional pulse remains the same so that there is no smoothening action produced.

If the pause duration is more than 5 time periods, then the irregularities on the processing surface get solidified in the same form and additional energy is required for heating & producing the smoothening effect. The optimum pause between the additional pulses is equal to the time required by the melt, formed by the previous current pulse, to crystallize.

By carrying out the spark coating in the manner described above, it is possible to deposit any desired thickness of a material on metallic work pieces, in particular iron and its alloys, at any desired predetermined coating rate. The process described in the present invention obtains dense and uniform coatings. Porosity and surface roughness in the coatings thus obtained is reduced to significantly low levels. Thus subsequent operations such as machining or grinding are not required to remove the external rough layer, thereby resulting in cost saving. Moreover, the thickness of the coating obtained by this method is significantly more than that obtainable by other earlier techniques. Components prepared by this process can be directly used in applications where high wear and corrosion resistance is required. Further the coatings produced by this method are more hard, adherent, smooth, dense and uniform than the coatings produced by previous methods.

With the invention described above, it is possible to deposit large amounts of material from consumable electrode materials (coating material) on to the surfaces of work pieces that are to be coated. Moreover, the resulting surface roughness will be lower than that from previous methods. Higher deposition rate/pass is preferred as subsequent passes though increase the thickness of the deposited coating the increase in roughness is very high. This was due to the fact that the anode to cathode gap is so low that the surface irregularities alone will grow at the expense of the surrounding area. With the method as explained above consumable electrodes of circular cross section 0.5 to 10 mm diameter and a square cross section of 0.5×0.5 mm to 10×10 mm can be used for refurbishment of the worn components such as shafts, valves and turbine blades.

The device of the present invention operates at very low voltages more specifically less than 40 volts, which is in contrast to all the previously known circuits where researchers have employed high voltage ranging 60 to 120 V or even more.

According to another embodiment of the present invention, there is provided an improved method for depositing any electrically conductive electrode material in the form of a rod on to the surface of any electrically conductive work piece to be coated by electrical discharges using the above-defined device.

By employing the device of the present invention, the sparks are generated which raise the instantaneous temperature to a level of the order of 10000° C., when the electric potential between the anode and cathode exceeds a critical value. A Consumable electrode in the form of a rod is connected as the anode while the work piece who's surface to be coated serves as the cathode. As a result, the tip of the consumable electrode melts and deposits on the surface of work piece. Melting of the electrode and deposition on work piece cycle is sharply controlled by the electrode repetition contact synchronized with capacitor discharge and recharge. This leads to the consumption of electrode at the rate of 30 to 50 mg/min and while 80% of consumed electrode is deposited on to the work piece, 20% is evaporated.

The essence of the invention lies in the fact that the main mass transfer takes place when the basic current pulse passes from the process electrode onto the work piece. During this pulse period, a layer of corresponding thickness is deposited on the work piece. The action of the additional pulses is to produce electrospark smoothening of the roughness in the layer, which is formed by the main pulse. Additional 'smoothening' pulses with decreasing amplitudes therefore follow the main operating current pulse, their main function being to smoothen out the roughness.

The production of high current pulses may be accomplished at the rate of 100 to 12000 packets per second. Negative pole is connected to the work piece i.e. cathode who's surface is to be coated and positive terminal is connected to the electrode i.e. anode which is to be deposited through a vibro-excitor which oscillates at a frequency of 50 to 300 Hz and 3 to 20 volts amplitude.

The following Examples illustrate the ability of the process using the device of the present invention, which are given only for the purposes of illustration and therefore should not be construed to limit the scope of the invention.

EXAMPLE 1

An electrode 4×4×30 mm size produced from tungsten carbide with 8% cobalt (WC-8Co) is employed for deposition of coating on the surface of low carbon steel sample with 6 mm dia.×30 mm length dimensions. The sample is intended for the measurements of deposition rate, microhardness, surface roughness and performance evaluation of the coating-using pin on disk method as per ASTM G65 specification. Coating is applied in ambient air at pulse amplitudes of 850, 560, 560 amps. and each pause equals to twice the duration of the previous pulse for $1^{st}$, $2^{nd}$, and $3^{rd}$ pulses of the packet of pulses respectively, 35 V potential, 100 Hz vibrator frequency and at a deposition rate of 1 cm$^2$/min. The average coating deposition rate, surface roughness and microhardness measured from the sample are 25 mg/pass/min (approx. 130 μm thickness), 10-12 μm $R_a$ and 1250 $Hv_{0.02}$ respectively. The deposition rate mentioned above is more than 10 times faster than the known prior art. The coating resulting from the above method was found to exhibit a fully dense layer with very good adhesion to the substrate and 90% continuity.

Subsequently the same sample is used for performance evaluation in relative wear assessment of coated sample vis-à-vis uncoated low carbon steel sample of the same dimensions at a sliding velocity of 5.75 msec and 30 N normal load against a rotating hard sintered WC-6Co disk. The resulting steady state sliding wear loss for the coated sample is measured to be 1100 times lower than the uncoated low carbon steel sample.

The above results clearly illustrate the fact that the carbide coatings obtained by the method using the device of the present invention results in excellent improvement in wear resistance of the components produced from low carbon steel.

EXAMPLE 2

Colmonoy 6 electrode, 4 mm diameter×50 mm length (Cr 14.3, B 3.0, Si 4.25, Fe 4.0, C 0.70 and Ni rest)) is employed for deposition of coating on the surface of low carbon steel sample with 6 mm dia.×30 mm length dimensions. The sample is intended for the measurements of deposition rate, microhardness, surface roughness and performance evaluation of the coating-using pin on disk method as per ASTM G65 specification. Coating is applied in inert atmosphere at a flow rate of 20 cfm, current pulse amplitudes of 650, 450, 450 amps. and each pause equals to thrice the duration of the previous pulse for $1^{st}$, $2^{nd}$, and $3^{rd}$ pulses of the packet of pulses respectively, 35 V potential, 100 Hz vibrator frequency and at a deposition rate of 1 cm$^2$/min. The average coating deposition rate, surface roughness and microhardness measured from the sample are 47 mg/pass/min (approx. 300 μm thickness), 4-8 μm $R_a$ and 1060 $Hv_{0.02}$ respectively. The coating resulting from the above method is found to exhibit a fully dense layer with very good adhesion to the substrate and 90% continuity. Subsequently the same sample is used for performance evaluation in relative wear assessment of coated sample vis-à-vis uncoated low carbon steel sample of the same dimensions at a sliding velocity of 5.75 n/sec and 30 N normal load against a rotating hard sintered WC-6Co disk. The resulting steady state sliding wear loss for the coated sample is measured to be 4 times lower than the uncoated low carbon steel.

EXAMPLE 3

Wallex 1 electrode, 4 mm diameter×50 mm length (Cr 33, W 12.5, Si 1.25, Fe 3.0, Ni 3.0, C 2.30 and Co rest)) is employed for deposition of coating on the surface of low carbon steel sample with 6 mm dia.×30 mm length dimensions. The sample was intended for the measurements of deposition rate, microhardness, and surface roughness and for performance evaluation of the coating-using pin on disk method as per ASTM G65 specification. Coating is applied in inert atmosphere at a flow rate of 20 cfm, current pulse amplitudes of 650, 650, 650 amps. and each pause equals to thrice the duration of the previous pulse for $1^{st}$, $2^{nd}$, and $3^{rd}$ pulses of the packet of pulses respectively, 35 V potential, 100 Hz vibrator frequency and at a deposition rate of 1 cm$^2$/min. The average coating deposition rate, surface roughness and microhardness measured from the sample are 32 mg/pass/min (approx. 200 μm thickness), 6-10 μm R.sub.a and 910 $Hv_{0.02}$ respectively. The coating resulting from the above method is found to exhibit a fully dense layer with very good adhesion to the substrate and 90% continuity. Subsequently the same sample is used for performance evaluation in relative wear assessment of coated sample vis-à-vis uncoated low carbon steel sample of the same dimensions at a sliding velocity of 5.75 m/sec and 30 N normal load against a rotating hard sintered WC-6Co disk. The resulting steady state sliding wear loss for the coated sample is measured to be 2 times lower than the uncoated low carbon steel sample.

Thus spark coating device and the method of coating using the said device of the present invention is capable of depositing metallic coatings having thickness range of 10 to 300 micrometers. Furthermore, these coatings are applied by a very low heat input process and hence found not affecting the microstructure of the substrate/work piece. Consequently, these coatings can be used for rebuilding, repairing and restoring the worn components produced from electrically conducting work piece and low carbon steel in particular.

It would be obvious for anyone having a reasonable working knowledge in this field those additional modifications and changes can be incorporated in the invention disclosed. Accordingly, such modifications and changes are also covered within the scope of the present invention.

ADVANTAGES OF THE INVENTION

1. The working voltage for the method of coating any electrically conductive materials on the surface of any electrically conducting work piece using the device of the present invention is very low and hence operator safety is fully ensured
2. Since a multiple pulse train known as "packets" is employed for discharging the stored capacitor energy in carrying out the method of coating using the device of the present invention, more uniform and continuous coating with lower surface roughness is achieved
3. Because of the usage of multiple pulse train or "packets", in the method of coating using the device of the present invention lower current amplitudes are able to produce deposition rates which are comparable or better than that of the prior art known methods
4. The use of lower current amplitudes in the method of coating using the device of the present invention results in lower heat inputs at the substrate and electrode holders. Therefore it results in no or negligible heat affected zone (HAZ) at the interface of coating and the substrate/work piece.
5. Coatings obtained by the method using the device of the present invention are uniformly dense and bonded well with the substrate.
6. Coatings obtained by the method using the device of present invention are relatively smoother than those obtained by the prior art known methods.
7. Engineering components coated by the method using the device of the present invention can be directly used for wear and corrosion resistant applications. Therefore costlier post coating operations such as grinding, polishing etc can be avoided.
8. Coatings produced by the method using the device of the present invention are harder, adherent, smooth, dense and uniform than those produced by the hitherto known prior art processes.

The invention claimed is:
1. A method of depositing electrically conductive electrode material onto a top surface of an electrically conductive work piece comprising:
applying three current pulses between the electrically conductive electrode material and the top surface of the electrically conductive work piece;
pausing between a first current pulse and a second current pulse for a duration no less than twice the duration of the first current pulse to ensure that any molten metal mass has re-crystallized and for a duration of no more than five times the duration of the first current pulse to prevent irregularities on the top surface of the electrically conductive work piece to solidify; and
pausing between the second current pulse and a third current pulse for a duration no less than twice the duration of the second current pulse to ensure that any molten metal mass has re-crystallized and for a duration of no more than five times the duration of the second current pulse to prevent irregularities on the top surface of the electrically conductive work piece to solidify, wherein the first current pulse has a first amplitude, the second current pulse has a second amplitude, and the third current pulse has a third amplitude, and wherein the first amplitude is greater than the second amplitude and the third amplitude such that main mass transfer takes place when the first current pulse passes from the conductive electrode material onto the top surface of the electrically conductive work piece, thereby forming a layer of material onto the to surface of the electrically conductive work piece, and the second current pulse and the third current pulse produce electro-spark smoothening of the roughness in the layer which is formed by the first current pulse.

2. The method of claim 1, wherein the third current pulse has a third amplitude that is the same as the second amplitude.

3. The method of claim 1, wherein the second amplitude is between 30% and 70% of the first amplitude.

\* \* \* \* \*

UNITED STATES PATENT AND TRADEMARK OFFICE
CERTIFICATE OF CORRECTION

PATENT NO. : 8,674,262 B2
APPLICATION NO. : 13/208721
DATED : March 18, 2014
INVENTOR(S) : Kalidindi Ramachandra Soma Raju

Page 1 of 1

It is certified that error appears in the above-identified patent and that said Letters Patent is hereby corrected as shown below:

In the Claims

Column 13, Line 14, Claim 1, delete "to" and insert -- top --

Signed and Sealed this
Ninth Day of September, 2014

Michelle K. Lee
*Deputy Director of the United States Patent and Trademark Office*